(12) United States Patent
Kawabata et al.

(10) Patent No.: US 6,188,625 B1
(45) Date of Patent: Feb. 13, 2001

(54) SEMICONDUCTOR MEMORY

(75) Inventors: Kuninori Kawabata; Masato Matsumiya; Satoshi Eto; Akira Kikutake, all of Kawasaki (JP)

(73) Assignee: Fujitsu Limited, Kawasaki (JP)

( * ) Notice: Under 35 U.S.C. 154(b), the term of this patent shall be extended for 0 days.

(21) Appl. No.: 09/461,721

(22) Filed: Dec. 16, 1999

(30) Foreign Application Priority Data

Apr. 21, 1999 (JP) .................................................. 11-114218

(51) Int. Cl.$^7$ ...................................................... G11C 13/00
(52) U.S. Cl. ...................................... 365/207; 365/230.03
(58) Field of Search .................................. 365/226, 201, 365/207, 230.01, 230.03

(56) References Cited

U.S. PATENT DOCUMENTS 6,041,013 * 3/2000 Kohno .............................. 365/230.03

* cited by examiner

Primary Examiner—Terrell W. Fears
(74) Attorney, Agent, or Firm—Arent Fox Kintner Plotkin & Kahn PLLC

(57) ABSTRACT

For cutting off a path for flowing a read detection current from a high-potential power supply (Vii) of a read data bus amplifier (S/B 33) to the ground side of a read controller (41) via a sense amplifier (31) selected based on an address in a write to a memory cell, a semiconductor memory device have a logic circuit (42, 43) for calculating logic between a block select signal and a write status signal to change the potential at the read controller (41) to the same power supply potential as that at the S/B (33) when the write status signal is activated. This logic circuit can prevent any unwanted read detection current from flowing in a data write, so as to suppress current consumption in a write.

16 Claims, 13 Drawing Sheets

FIRST EMBODIMENT OF INVENTION

ARRANGEMENT OF DRAM

ARRANGEMENT OF S/B

RELATED ART (1)

F I G. 4
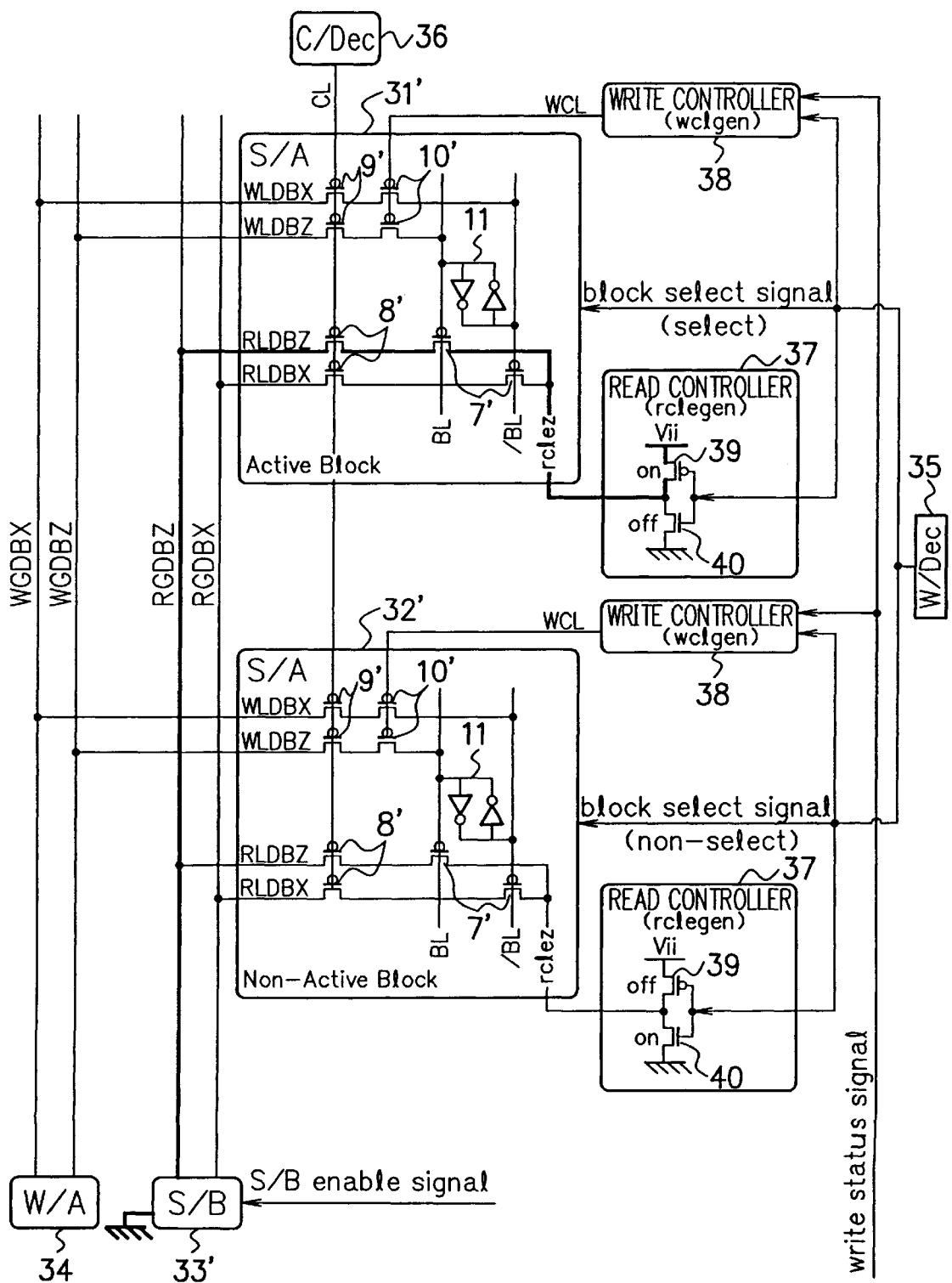
RELATED ART (2)

ARRANGEMENT OF S/B

FIRST EMBODIMENT OF INVENTION

SECOND EMBODIMENT OF INVENTION

THIRD EMBODIMENT OF INVENTION

FOURTH EMBODIMENT OF INVENTION

FIFTH EMBODIMENT (1) OF INVENTION

FIFTH EMBODIMENT (2) OF INVENTION

FIFTH EMBODIMENT (3) OF INVENTION

FIFTH EMBODIMENT (4) OF INVENTION

SEMICONDUCTOR MEMORY

BACKGROUND OF THE INVENTION

1. Field of the Invention

The present invention relates to a semiconductor memory and, more particularly, to a semiconductor memory having a sense amplifier for reading out data of a selected memory cell as a voltage to a bit line and converting the readout voltage into a current, and a current detection type read data bus amplifier (sense buffer: S/B) for flowing a current to amplify data.

2. Description of the Related Art

FIGS. 1A to 1C show the arrangement of a DRAM as a typical example of a semiconductor memory. As shown in FIG. 1A, a one-chip 256M (megabit)-DRAM 1 has four 64M-blocks 2 on the chip, and each 64M-block 2 is divided into four banks (Bank0 to Bank3). FIG. 1B shows the internal arrangement of one bank. One bank incorporates, in the column direction, sixteen blocks 4 each having eight memory cell arrays 3 in the row direction.

FIG. 1C shows the internal arrangement of one block 4. Sense amplifiers (a plurality of S/As 5) are arranged above and below each memory cell array 3 in the block 4 (for example, one S/As 5 comprises four sense amplifiers). As shown in FIG. 1B, secondary amplifiers (AMPs) 6 each made up of, e.g., four sense buffers (S/Bs) are arranged on the final row in the bank for respective columns.

Word lines and bit lines perpendicular to each other are laid out in the bank, and memory cells formed at their intersections constitute the memory cell array 3. For example, in a data read, when a set of word and bit lines is selected by an externally input address, data of the memory cell at the intersection between the selected word and bit lines is read out as a voltage having a very small amplitude to the bit line. This voltage is amplified by a sense amplifier 5a, further amplified by the secondary amplifier 6, and then externally output.

Note that the word line is selected based on a signal obtained by decoding an input address by a main word decoder (MW/Ds) and a sub-word decoder (SW/Ds). The column line is selected based on a signal obtained by decoding an input address by a column decoder (C/Ds). A sense amplifier 5 to be operated is selected based on a read enable signal rclex generated by a read controller (rclrgen) based on an address.

As shown in FIG. 1C, the sense amplifier 5a is a direct sense amplifier in which bit lines BL and /BL ("/" indicates an inverted signal) are connected to the gates of n-channel transistors. That is, the bit lines BL and /BL are respectively connected to the gates of two n-channel transistors 7. The sources or drains of the transistors 7 are respectively connected to read data buses RLDBX and RLDBZ via n-channel transistors 8 for selecting a column line CL. The drains or sources of the n-channel transistors 7 receive the read enable signal rclex.

In a standby state (precharge state), the read enable signal rclex is at "H", the n-channel transistors 7 are OFF, so no read detection current flows through the read data buses RLDBX and RLDBZ. When the read enable signal rclex changes to "L", a large current flows through the high-potential side of the n-channel transistors 7 in accordance with the voltage difference between a pair of bit lines BL and /BL selected by a column address. An amplifier 11 detects and amplifies a current difference corresponding to the amplitude of the pair of bit lines BL and /BL, so as to flow a read detection current through the read data buses RLDBX and RLDBZ.

In a data write, n-channel transistors 9 for selecting the column line CL are turned on, n-channel transistors 10 for selecting a write column line WCL are turned on, and data input from write data buses WLDBX and WLDBZ are transmitted to the pair of bit lines BL and /BL. The data is written in the memory cell at the intersection between the pair of bit lines BL and /BL and a word line (not shown).

In semiconductor memories represented by a DRAM having this arrangement, demands are recently arising for high-speed operation at low voltages. As the voltage decreases, a sense buffer (S/B) functioning as a read data bus amplifier employs a current detection type S/B capable of detecting and amplifying even a very small current difference with high detection sensitivity, instead of a conventional voltage detection type S/B for detecting and amplifying a voltage difference.

This current detection type S/B is constituted as shown in, e.g., FIG. 2. In FIG. 2, two read signal input terminals rgdbx and rgdbz are respectively connected to the two read data buses RLDBX and RLDBZ shown in FIG. 1C, and receive signals read out from a memory cell via a pair of bit lines BL and /BL.

Two p-channel transistors 21 and 22 have the drains connected to the read signal input terminals rgdbx and rgdbz, the sources connected to a high-potential power supply Vii, and the gates grounded. The p-channel transistors 21 and 22 are always ON and function as a constant current source for supplying a current I.

An amplifier activation signal input terminal sbez receives an amplifier activation signal which changes to "H" in a read and to "L" in a write. When this amplifier activation signal changes to "H" in a read to select the S/B, a current difference is generated between a current $I-I_D$ input from one p-channel transistor 21 to an amplifier 23 and a current $I-I_D'$ input from the other p-channel transistor 22 to the amplifier 23 in accordance with a potential difference based on the amplitude of the pair of bit lines BL and /BL.

The amplifier 23 amplifies this current difference and outputs it from an output terminal rdbz via inverters 24 and 25. As shown in FIG. 2, this amplifier 23 is constituted by appropriately connecting p-channel transistors and n-channel transistors, and can be realized by a known arrangement. In this example, an amplified read detection signal is output in a single phase from one output terminal rdbz. But, another output terminal may be formed at the output of an inverter 26.

FIG. 3 is a circuit diagram for explaining the operation of the sense amplifier shown in FIG. 1C in more detail. In FIG. 3, the same reference numerals as in FIG. 1C denote the same parts. Two S/As 31 and 32 shown in FIG. 3 are sense amplifiers arranged above and below a given memory cell array 3, as shown in FIG. 1C.

An S/B 33 has the arrangement shown in FIG. 2, and is connected to the S/As 31 and 32 (n-channel transistors 8 for selecting the column line CL) via read data buses RGDBX, RGDBZ, RLDBX, and RLDBZ. A W/A 34 is a write amplifier for amplifying a signal in a data write, and is connected to the S/As 31 and 32 (n-channel transistors 9 for selecting the column line CL) via write data buses WGDBX, WGDBZ, WLDBX, and WLDBZ.

As an address (not shown) externally input to the DRAM, a row address and a column address are input time-divisionally from the same address terminal. The row address is decoded by a row decoder (word decoder) 35 and supplied as a block select signal for selecting one of the blocks shown in FIG. 1B.

This block select signal is supplied to the S/As 31 and 32 as a sense amplifier activation signal for activating the sense amplifier, and also supplied to a read controller 37 and a write controller 38 (to be described later). In FIG. 3, the block select signal (sense amplifier activation signal) activates one S/A 31, while keeping the other S/A 32 non-active.

The column address is decoded by a column decoder 36 and supplied to the n-channel transistors 8 and 9 in each of the S/As 31 and 32 to control the ON/OFF state. A sense amplifier at the intersection between a block selected by the block select signal and a column selected by the column select signal is selected to read out/write data from/in the corresponding memory cell.

The read controller 37 cascade-connects a p-channel transistor 39 and an n-channel transistor 40 to connect their gates, and has a CMOS structure in which the transistors 39 and 40 are respectively connected to the high-potential power supply Vii and ground. The gate common to the transistors 39 and 40 receives the above-described block select signal. The drain commonly connected to the transistors 39 and 40 outputs the read enable signal rclex.

When the block select signal supplied to the read controller 37 changes to "H" in a data read, the p-channel transistor 39 and n-channel transistor 40 in the read controller 37 are turned off and on, respectively. Then, the read enable signal rclex changes to "L". As indicated by the thick line in FIG. 3, the current detection type S/B 33 flows and amplifies a read detection current from the connected high-potential power supply Vii to the ground of the read controller 37.

In a standby state (precharge state), the block select signal changes to "L" to turn the p-channel transistor 39 on and the n-channel transistor 40 off. Thus, no read detection current flows.

The write controller 38 controls whether to write data in memory cells in a block selected by the block select signal on the basis of the block select signal and write status signal. The write status signal changes to "L" in a read and to "H" in a write. When the write status signal supplied to the write controller 38 changes to "H", the n-channel transistor 10 for selecting the write column line WCL is turned on. The n-channel transistor 9 of the S/A 31 selected by the block select signal and column select signal is turned on to write data via the write data buses WGDBX, WGDBZ, WLDBX, and WLDBZ using the S/A 31.

In the related art, the read controller 37 ON/OFF-controls the internal transistors 39 and 40 on the basis of the block select signal. But, this block select signal is supplied in both a data read and write. In a selected block, the read enable signal rclex changes to "L" not only in a read but also in a write. The read data buses RGDBX, RGDBZ, RLDBX, and RLDBZ are precharged to "H" in a standby state in which no amplifier is used.

As a result, a current undesirably flows from the S/B 33 to the read controller 37 via the read data buses RGDBX, RGDBZ, RLDBX, and RLDBZ regardless of a write, so current consumption in a write increases. An unwanted read detection current flowing in a write may influence the write detection current to cause a malfunction.

In FIG. 3, the read detection current flows from the high-potential power supply Vii of the S/B 33 to the ground potential of the read controller 37. To the contrary, the DRAM may be constituted to flow the read detection current from the high-potential power supply Vii of the read controller 37 to the ground potential of an S/B 33', as shown in FIG. 4.

In FIG. 4, the n-channel transistors 7 to 10 used in the S/As 31 and 32 of FIG. 3 are replaced by p-channel transistors 7' to 10'. In FIG. 4, the block select signal, write status signal, and S/B activation signal have polarities opposite to those in FIG. 3, and change to "L" in an active state and to "H" in a non-active state.

In FIGS. 3 and 4, the read data buses RLDBX and RLDBZ, and the read data buses RGDBX and RGDBZ are respectively reversed. The read enable signal rclex in FIG. 3 is replaced with a read enable signal rclez having the opposite polarity in FIG. 4. Note that "x" suffixed the signal name indicates a signal which changes to "L" in an active state, and "z" indicates a signal which changes to "H" in an active state.

In this arrangement, the S/B 33' is constituted as shown in FIG. 5. In FIG. 5, the same reference numerals with a symbol "'" as in FIG. 2 denote the same parts. In FIG. 5, n-channel transistors 21' and 22' and p- and n-channel transistors in an amplifier 23' are connected to the high-potential power supply Vii and ground potential, reversely to those in FIG. 2. Further, the S/B activation signal sbez is replaced with sbex.

Even in the arrangements in FIGS. 4 and 5, as indicated by the bold line in FIG. 4, a current undesirably flows from the read controller 37 to the S/B 33' via the read data buses RGDBX, RGDBZ, RLDBX, and RLDBZ regardless of a write, so current consumption in a write increases.

SUMMARY OF THE INVENTION

The present invention has been made to overcome the conventional drawbacks, and aims to prevent any read detection current from flowing onto a read data bus in a write.

To achieve the above object, according to the present invention, there is provided a semiconductor memory device having a sense amplifier and a bus amplifier for amplifying data of a selected memory cell, comprising cutoff circuit for cutting off a path for flowing a read detection current via the sense amplifier and bus amplifier selected based on an address in a data write to the selected memory cell.

The cutoff circuit comprises circuit for, e.g., calculating logic between a select signal generated based on the address and a write status signal, so as to change the potential at an enable signal generation circuit for operating the sense amplifier, into the same potential as that at the bus amplifier when the write status signal is activated.

In another aspect of the present invention, the cutoff circuit comprises circuit for calculating logic between a select signal generated based on the address and a write status signal, so as to open connection of an enable signal generation circuit for operating the sense amplifier when the write status signal is activated.

In still another aspect of the present invention, the cutoff circuit comprises switching circuit which is turned on/off in accordance with a write status signal, and opens connection of the bus amplifier when the write status signal is activated, or switching circuit which is turned on/off in accordance with an inverted signal of a bus amplifier activation signal, and opens connection of the bus amplifier when the bus amplifier activation signal is activated.

According to the present invention having this arrangement, the path for flowing the read detection current via the sense amplifier and bus amplifier selected based on the address is cut off in the data write to the memory cell. In the write, only a write detection current can flow to prevent any unwanted read detection current from flowing in the write. This can suppress current consumption in the write and prevent any malfunction.

BRIEF DESCRIPTION OF THE DRAWINGS

FIGS. 1A to 1C are diagrams showing an example of the arrangement of a typical DRAM, in which FIG. 1A shows the whole arrangement of the DRAM, FIG. 1B shows the internal arrangement of one bank, and FIG. 1C shows the internal arrangement of one block;

FIG. 4 is a circuit diagram showing another example of part of the arrangement of the conventional semiconductor memory;

DETAILED DESCRIPTION OF THE PREFERRED EMBODIMENTS

Preferred embodiments of the present invention will be described below with reference to the accompanying drawings.

[First Embodiment]

Figure 3:
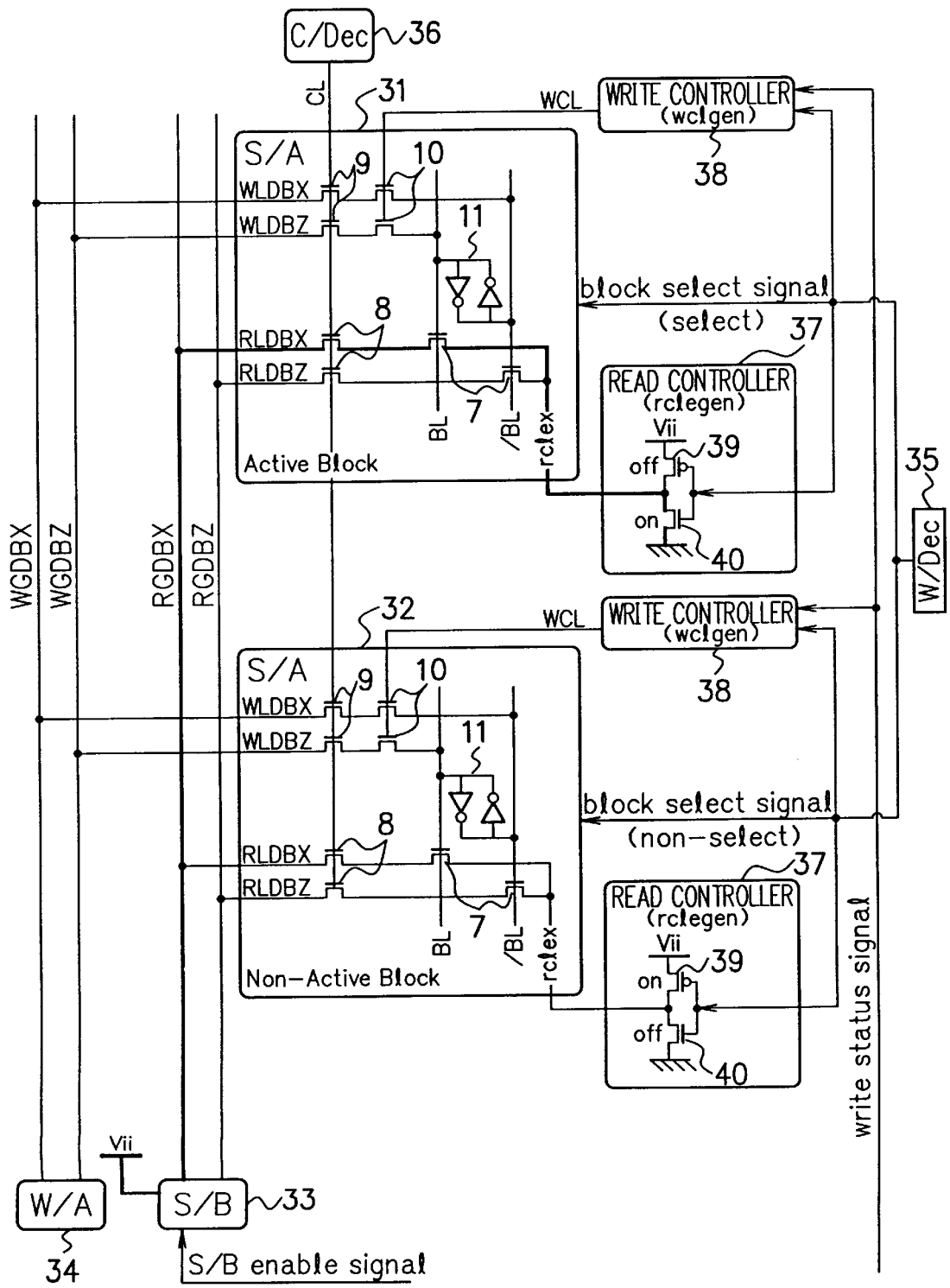
FIG. 3 is a circuit diagram showing part of the arrangement of a conventional semiconductor memory.
Figure 6:
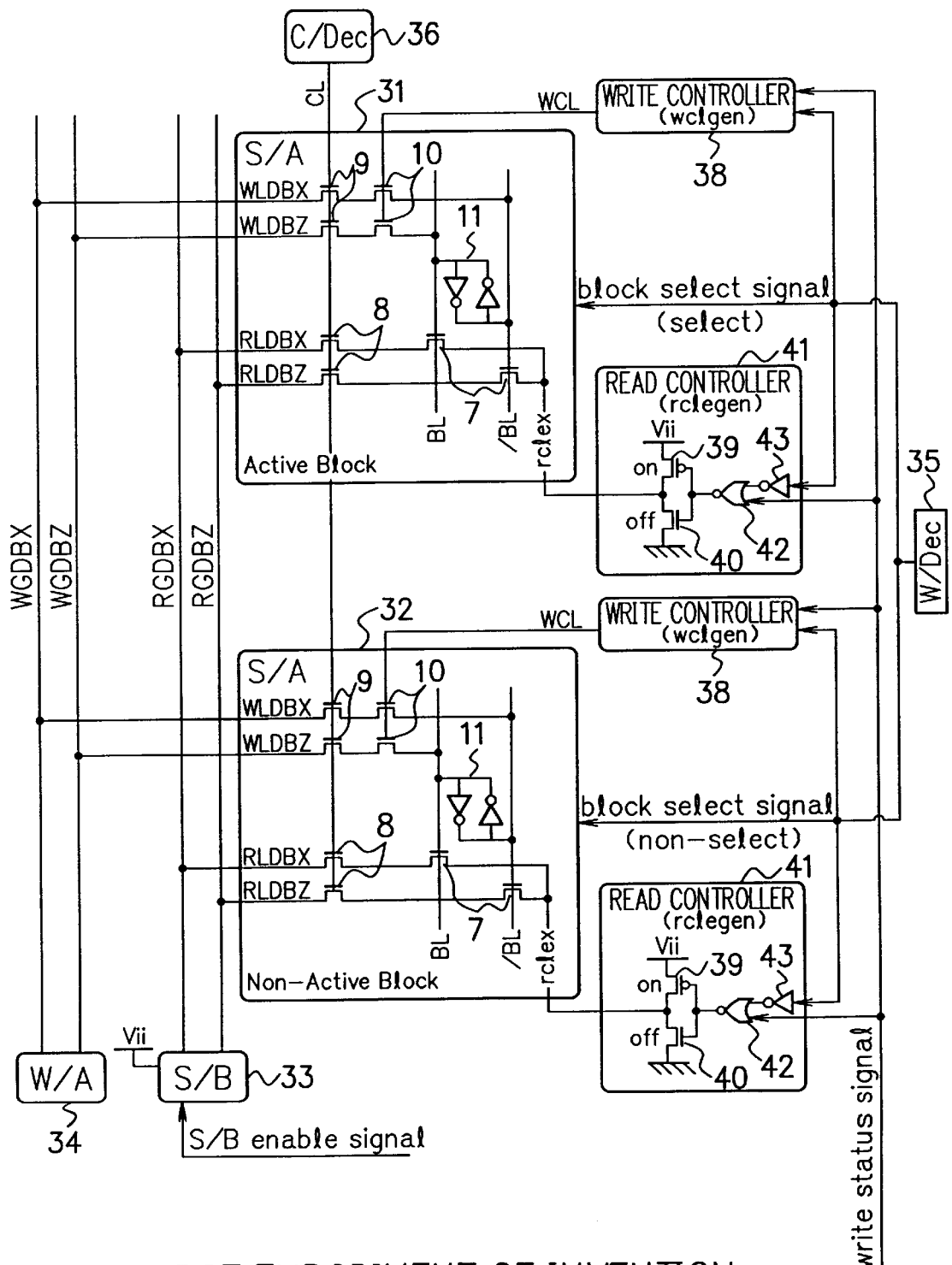
FIG. 6 is a circuit diagram showing part of the arrangement of a semiconductor memory according to the first embodiment of the present invention.

FIG. 6 is a circuit diagram showing part of the arrangement of a semiconductor memory according to the first embodiment of the present invention. The same reference numerals as in FIG. 3 denote the same parts as in FIG. 3. In FIG. 6, a write status signal input to a write controller 38 changes to "L" in a read and to "H" in a write, as described above. In the related art shown in FIG. 3, this write status signal is input to the write controller 38 only, and used as a dedicated control signal for selecting the write column select line WCL.

To the contrary, in the first embodiment, the write status signal is also supplied to each read controller (read enable signal generation circuit) 41. The read controller 41 of the first embodiment comprises a NOR gate 42 and an inverter (NOT gate) 43 in addition to a p-channel transistor 39 and an n-channel transistor 40 in the read controller 37 of FIG. 3.

The inverter 43 receives a block select signal output from a word decoder 35. The NOR gate 42 receives an output signal from the inverter 43 and the write status signal, and supplies an output to a gate common to the p-channel transistor 39 and n-channel transistor 40.

In this arrangement, when the write status signal changes to "H" in a write, the block select signal, which has changed to "H" in order to select a block subjected to a data write, is gated through the NOR gate 42 in the read controller 41 to output an "L" logic signal from the NOR gate 42.

Then, the p-channel transistor 39 and n-channel transistor 40 are respectively turned on and off similarly to the case in which the block select signal changes to "L". A voltage-to-current conversion enable signal rclex can change to the same "H" level as a high-potential power supply Vii of an S/B (read data bus amplifier) 33 to prevent any read detection current from flowing from the S/B 33 to the read controller 41.

When the write status signal changes to "L" in a read, the ON/OFF states of the p-channel transistor 39 and n-channel transistor 40 depend on the block select signal. More specifically, when the block select signal supplied to the read controller 41 changes to "H", the NOR gate 42 outputs an "H" logic signal to turn the p-channel transistor 39 off and the n-channel transistor 40 on. As a result, the read enable signal rclex changes to "L". The read detection current flows from the S/B 33 to the read controller 41, and is amplified.

When the block select signal changes to "L", the NOR gate 42 outputs an "L" logic signal to turn the p-channel transistor 39 on and the n-channel transistor 40 off. Then, the read enable signal rclex changes to "H". In this case, no read detection current flows from the S/B 33 to the read controller 41.

[Second Embodiment]

Figure 7:
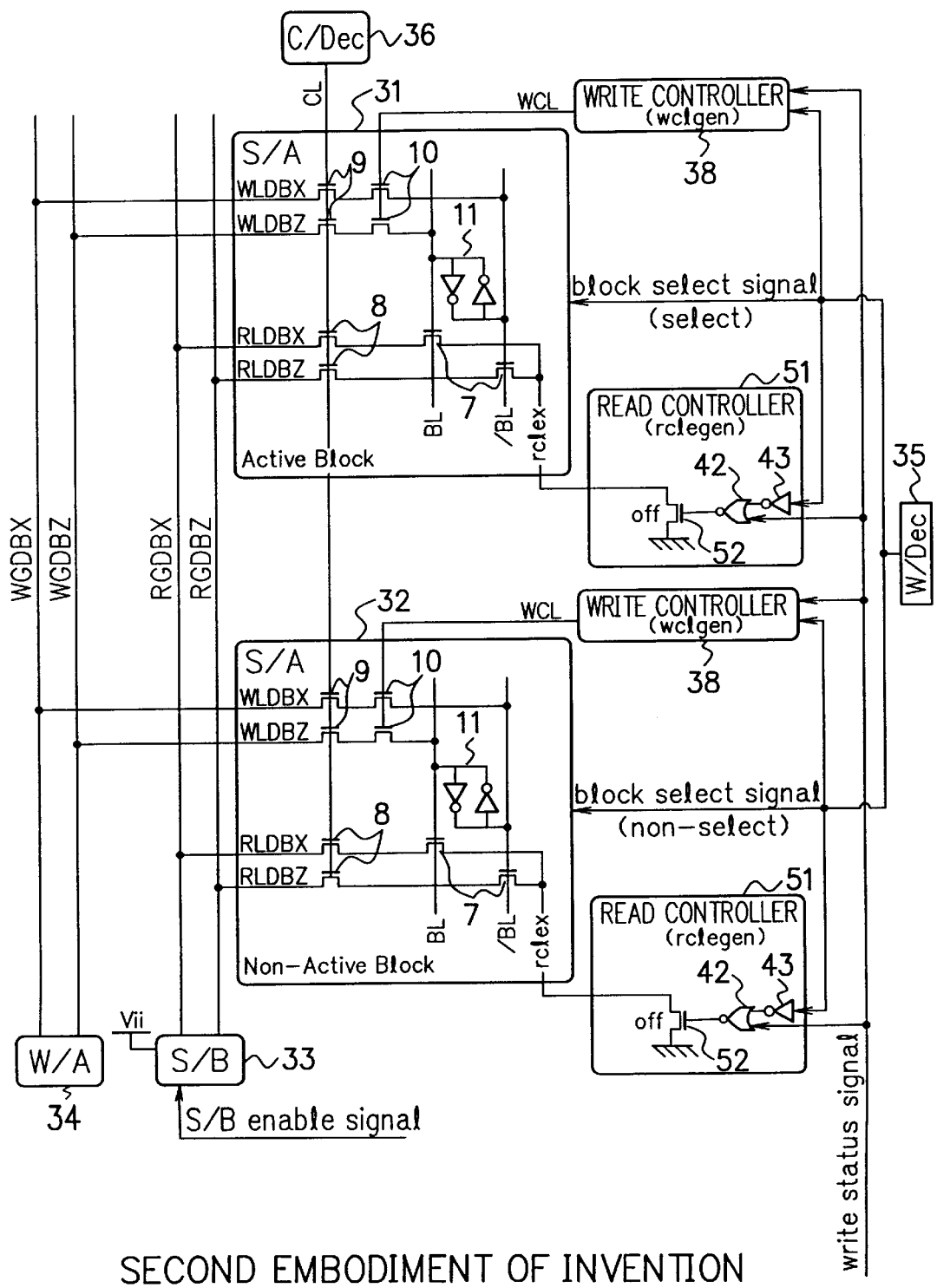
FIG. 7 is a circuit diagram showing part of the arrangement of a semiconductor memory according to the second embodiment of the present invention.

The second embodiment of the present invention will be described. FIG. 7 is a circuit diagram showing part of the arrangement of a semiconductor memory according to the second embodiment. The second embodiment shown in FIG. 7 is the same as the first embodiment shown in FIG. 6 in the feature that the write status signal is supplied to each read controller 51. But, the read controller 51 of the second embodiment has a different internal arrangement from that of the read controller 41 shown in FIG. 6.

More specifically, in the first embodiment, the driver of the read controller 41 is constituted by a CMOS structure using the p-channel transistor 39 and n-channel transistor 40. To the contrary, the read controller 51 of the second embodiment is constituted by an n-channel transistor 52 only. Input signals to a NOR gate 42 and an inverter 43 are identical to those in the first embodiment. The output of the NOR gate 42 is connected to the gate of the n-channel transistor 52. The source and drain of the n-channel transistor 52 are respectively connected to the ground and the read enable signal rclex.

In the second embodiment having this arrangement, like the first embodiment, when the write status signal changes to "H" in a write, a block select signal, which has changed to "H" in order to select a block subjected to a data write, is gated through the NOR gate 42 in the read controller 51 to supply an "L" logical signal from the NOR gate 42 to the gate of the n-channel transistor 52. The n-channel transistor 52 can be turned off to prevent any read detection current from flowing from the S/B 33 to the read controller 51.

Figure 1B:
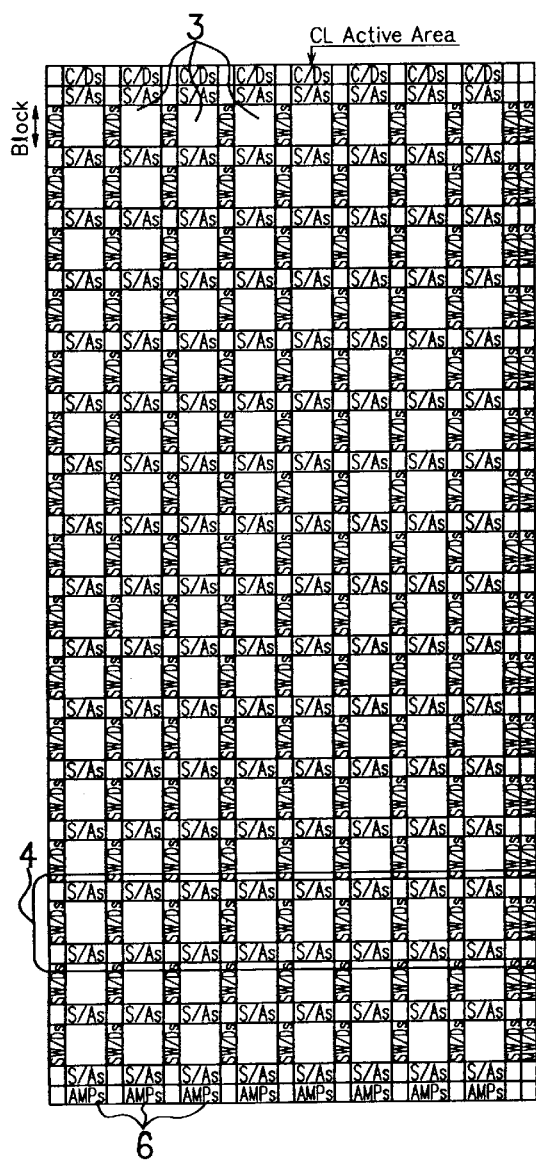
Figure 1A:
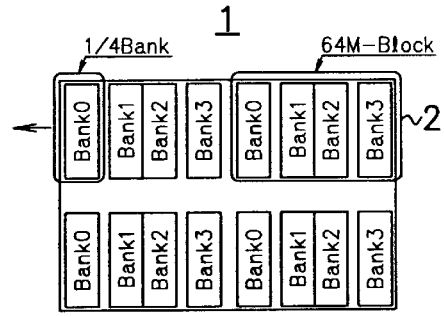
Figure 1C:
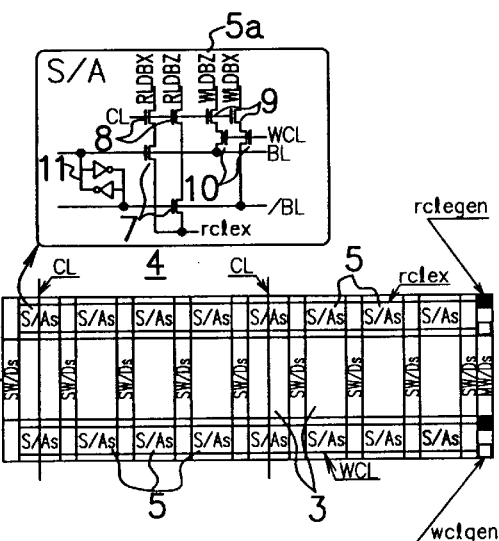

In this way, the second embodiment can not only prevent any wasteful current from flowing through read data buses RGDBX, RGDBZ, RLDBX, and RLDBZ, but also simplify the arrangement of the read controller 51, compared to that in FIG. 6. As shown in FIG. 1C, the read controller 51 is formed at a small-area portion on the chip, so that the number of devices must be minimized to reduce the circuit area. The second embodiment can achieve a smaller number of devices than the first embodiment to reduce the circuit area satisfactorily.

But, since the second embodiment does not adopt any CMOS structure for the driver of the read controller 51, unlike the first embodiment shown in FIG. 6, the level of the read enable signal rclex may fluctuate owing to disturbance. In this case, a small leakage current may be generated in n-channel transistors 7 and 8 in S/As 31 and 32, and the n-channel transistor 52 in the read controller 51. When small power consumption is more important in trade-off with a simple circuit arrangement, the arrangement shown in FIG. 6 should be used.

[Third Embodiment]

Figure 2:
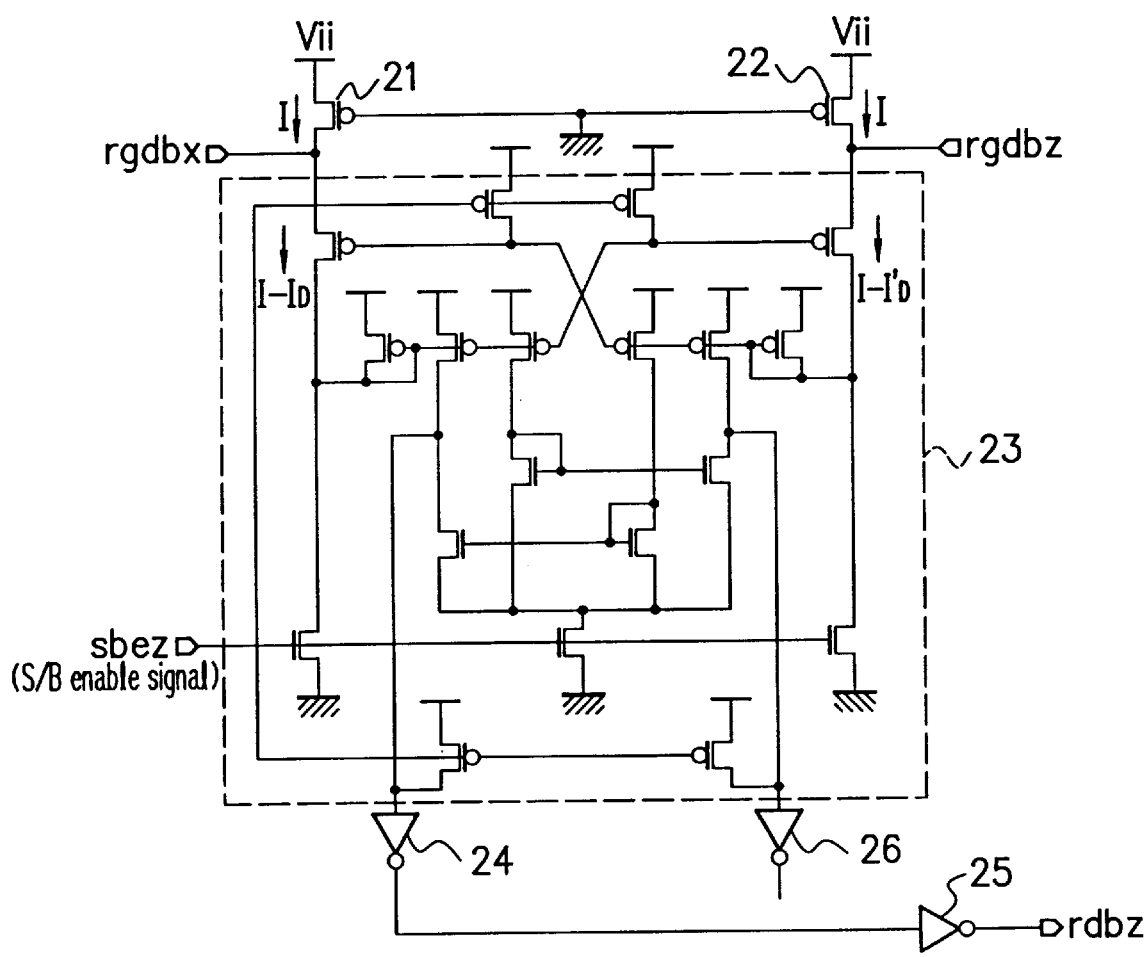
FIG. 2 is a circuit diagram showing an example of the arrangement of a typical S/B (read data bus amplifier)
Figure 8:
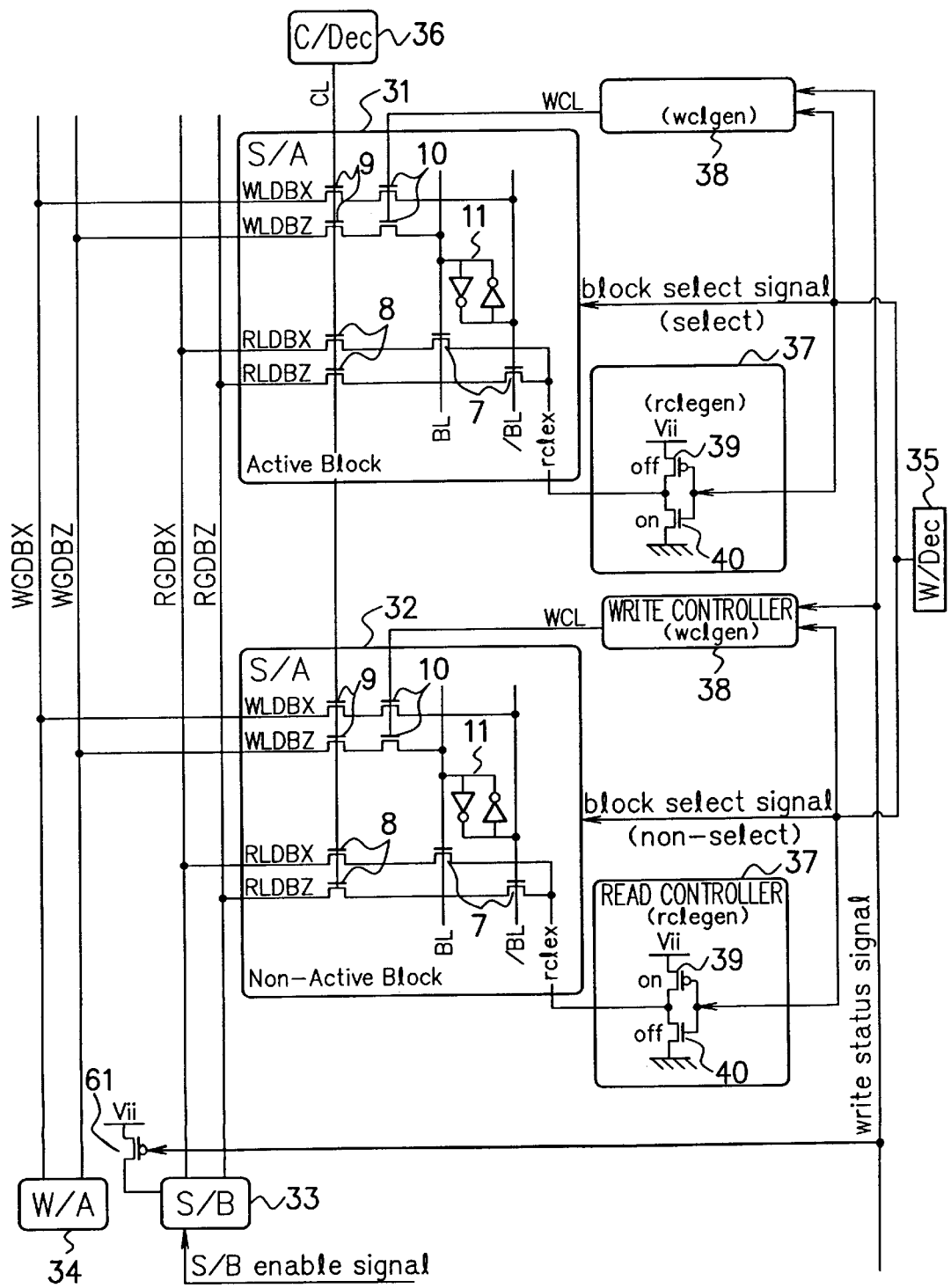
FIG. 8 is a circuit diagram showing part of the arrangement of a semiconductor memory according to the third embodiment of the present invention.

The third embodiment of the present invention will be described. In the third embodiment shown in FIG. 8, the arrangement of a read controller 37 is the same as in the related art shown in FIG. 3. In the third embodiment, the write status signal is supplied to the gate of a p-channel transistor 61 (corresponding to the two p-channel transistors 21 and 22 in FIG. 2) between a high-potential power supply Vii and an S/B 33. In this embodiment, the write status signal is supplied not to the read controller 37 but to the gate of the p-channel transistor 61 in addition to the write controller 38.

In the third embodiment having this arrangement, when the write status signal changes to "H" in a write, the p-channel transistor 61 is turned off to disconnect the S/B 33 from the high-potential power supply Vii, so no read detection current flows from the S/B 33 to the read controller 37. That is, the third embodiment can cut off the read detection current path on the S/B 33 side to prevent any wasteful current from flowing through read data buses RGDBX, RGDBZ, RLDBX, and RLDBZ in a write.

In a read, the write status signal changes to "L" to turn the p-channel transistor 61 on as normal.

[Fourth Embodiment]

Figure 9:
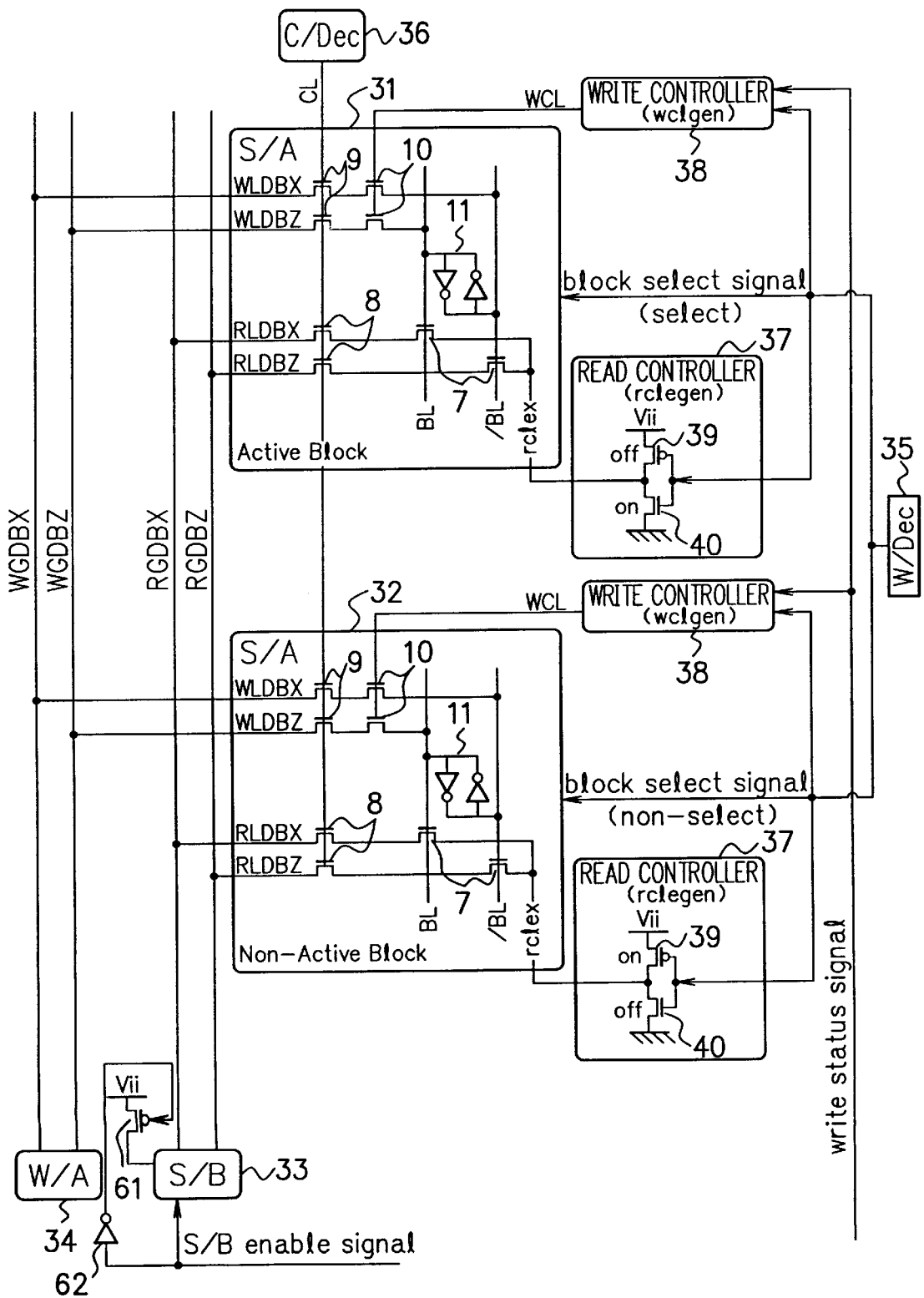
FIG. 9 is a circuit diagram showing part of the arrangement of a semiconductor memory according to the fourth embodiment of the present invention.

The fourth embodiment of the present invention will be described. The fourth embodiment shown in FIG. 9 is the same as the third embodiment in the feature that a p-channel transistor 61 exists between a high-potential power supply Vii and an S/B 33. But, the gate of the p-channel transistor 61 receives not the write status signal but a signal obtained by inverting an activation signal for the S/B 33 by a newly arranged inverter 62.

The activation signal input to the S/B 33 changes to "H" in a read and to "L" in a write, and has logic opposite to that of the write status signal. This S/B activation signal can be supplied to the gate of the p-channel transistor 61 via the inverter 62 to generate the same state as in the third embodiment.

More specifically, since the S/B activation signal changes to "H" in a read, the p-channel transistor 61 is normally turned on. In a write, the S/B activation signal changes to "L" and is supplied to the p-channel transistor 61 via the inverter 62 to turn the p-channel transistor 61 off. The S/B 33 is disconnected from the high-potential power supply Vii to prevent any read detection current from flowing from the S/B 33 to a read controller 37.

[Fifth Embodiment]

The first to fourth embodiments have exemplified a DRAM constituted to flow a read detection current from the high-potential power supply of the read data bus amplifier to the ground potential of the read controller. The present invention can also apply to a DRAM constituted to flow a read detection current from the high-potential power supply of the read controller to the ground potential of the read data bus amplifier.

The fifth embodiment concerns an example of the arrangement when the read detection current flows from the read controller to the read data bus amplifier. FIGS. 10 to 13 show arrangements corresponding to those shown in FIGS. 6 to 9. In FIGS. 10 to 13, the same reference numerals as in FIGS. 6 to 9 denote the same parts as in FIGS. 6 to 9, and the same reference numerals with a symbol "'" denote the same parts opposite in polarity and the like.

In FIGS. 10 to 13, all n-channel transistors 7 to 10 used in the S/As 31 and 32 in FIGS. 6 to 9 are replaced with p-channel transistors 7' to 10'. At the same time, the polarities of the block select signal, write status signal, and S/B activation signal are opposite to those in FIGS. 6 to 9. In other words, these signals change to "L" in an active state and to "H" in a non-active state in FIGS. 10 to 13.

Figure 5:
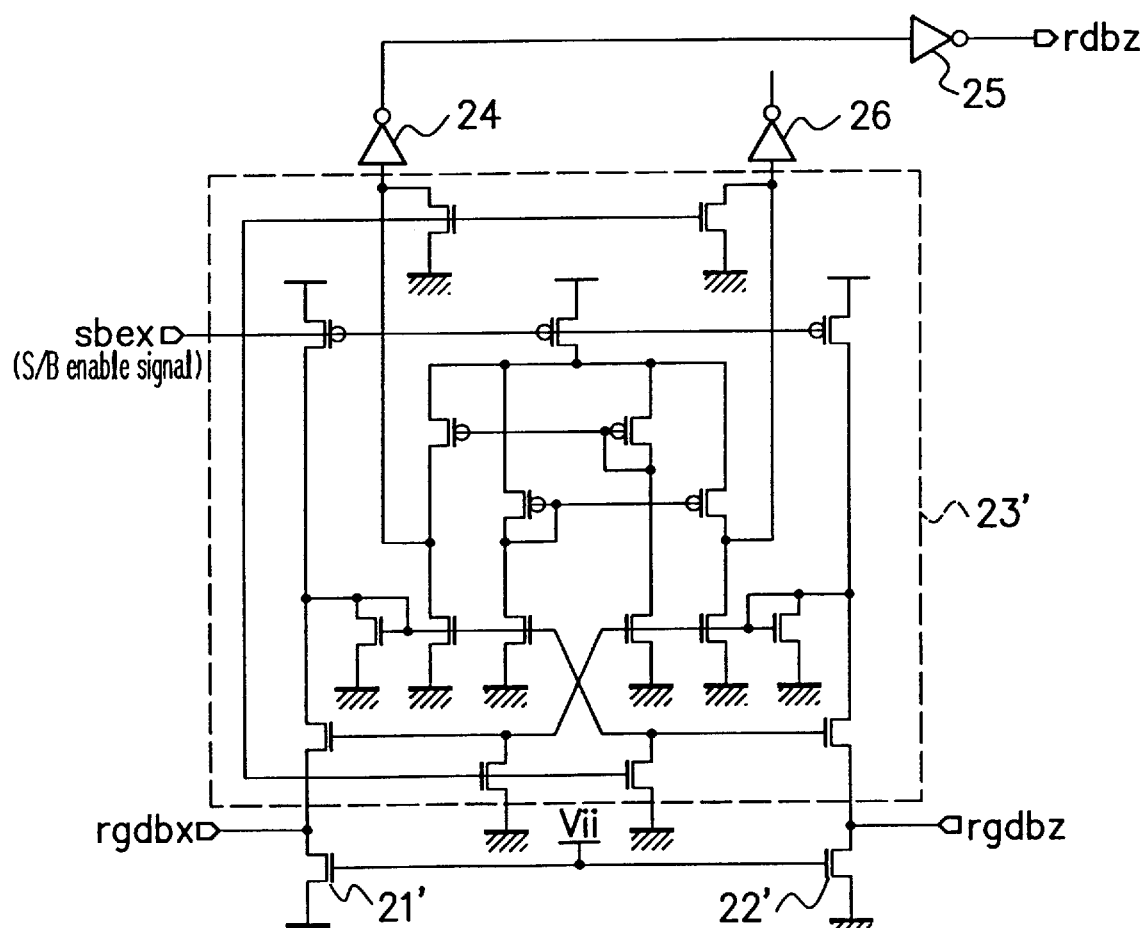
FIG. 5 is a circuit diagram showing another example of the arrangement of the S/B (read data bus amplifier)

In FIGS. 10 to 13, read data buses RLDBX and RLDBZ and read data buses RGDBX and RGDBZ are respectively reversed with each other, compared to those in FIGS. 6 to 9. The read enable signal rclex in FIGS. 6 to 9 is replaced with a read enable signal rclez having the opposite polarity in FIGS. 10 to 13. An S/B 33' is constituted as shown in FIG. 5.

Figure 10:
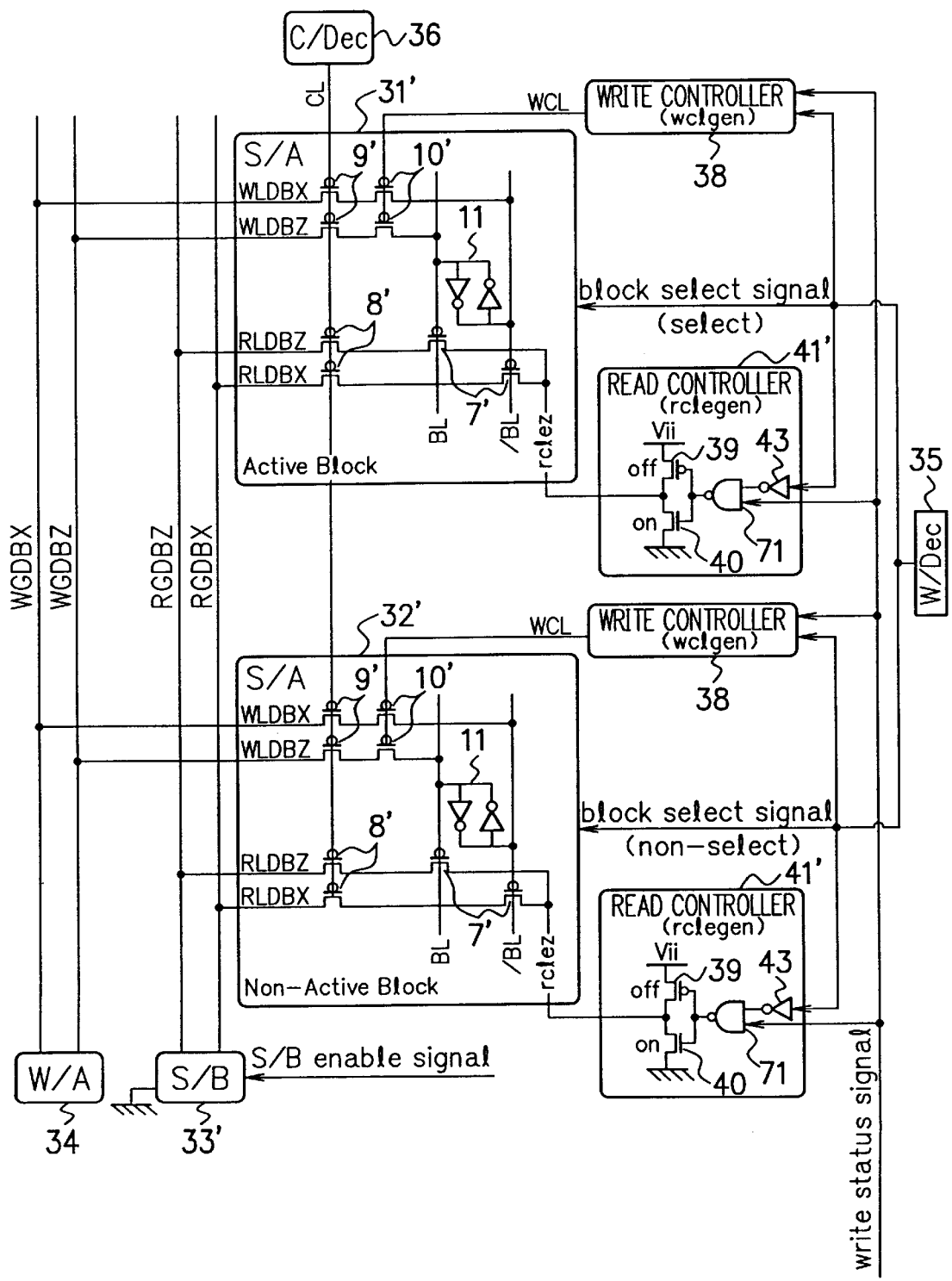
FIG. 10 is a circuit diagram showing part of the arrangement of a semiconductor memory according to the fifth embodiment of the present invention that corresponds to FIG. 6.
Figure 11:
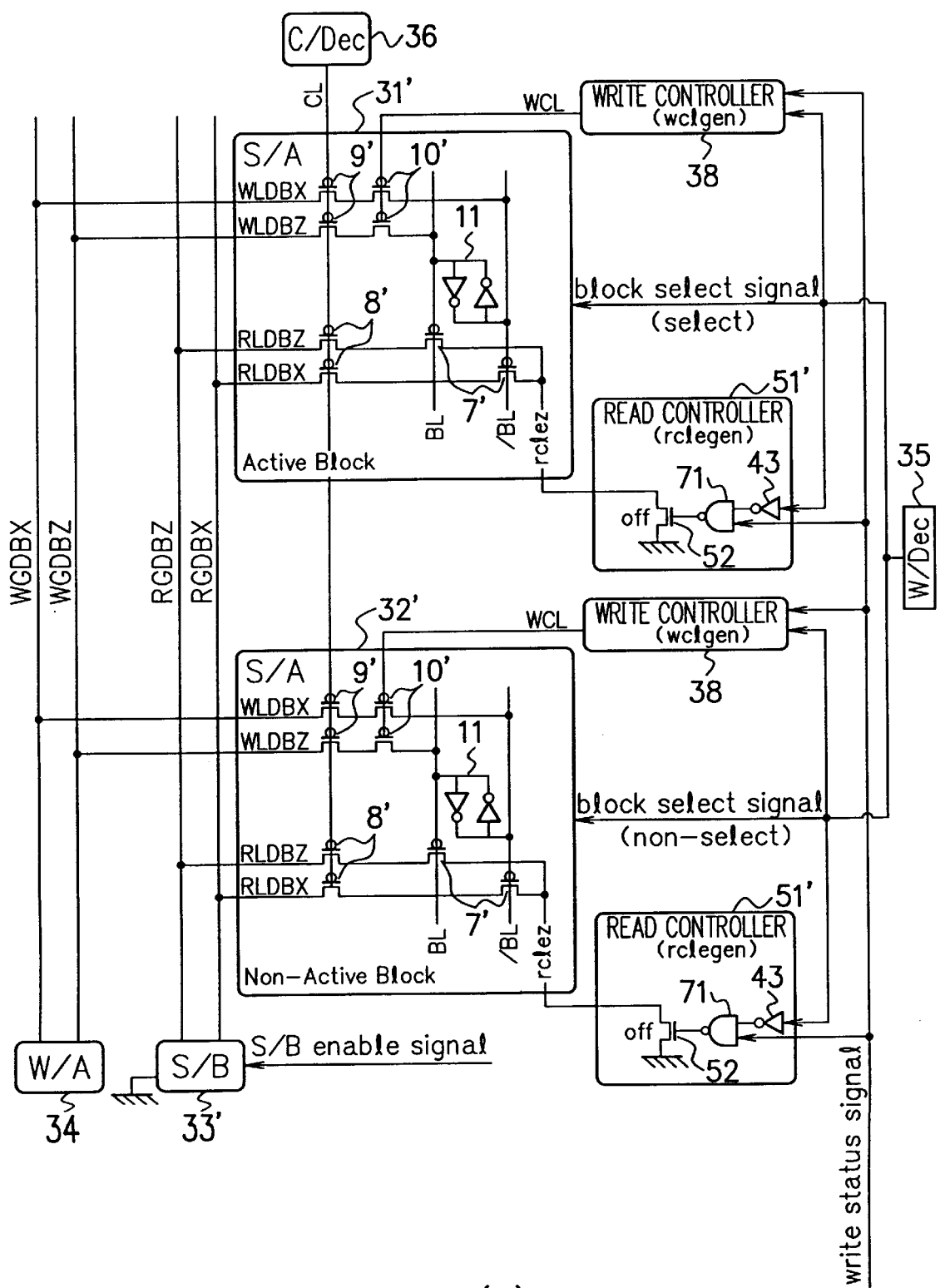
FIG. 11 is a circuit diagram showing part of the arrangement of the semiconductor memory according to the fifth embodiment of the present invention that corresponds to FIG. 7.
Figure 12:
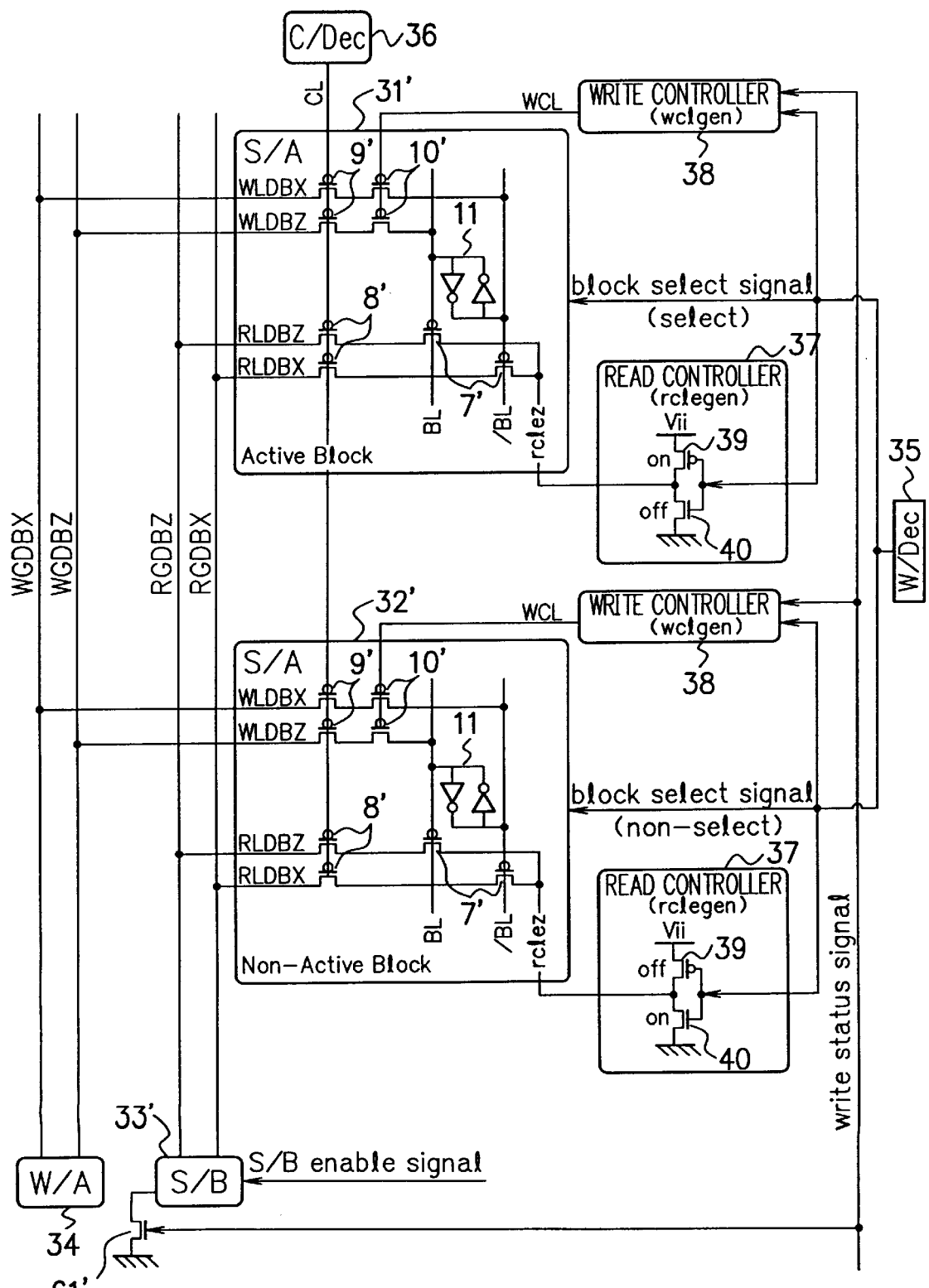
FIG. 12 is a circuit diagram showing part of the arrangement of the semiconductor memory according to the fifth embodiment of the present invention that corresponds to FIG. 8.
Figure 13:
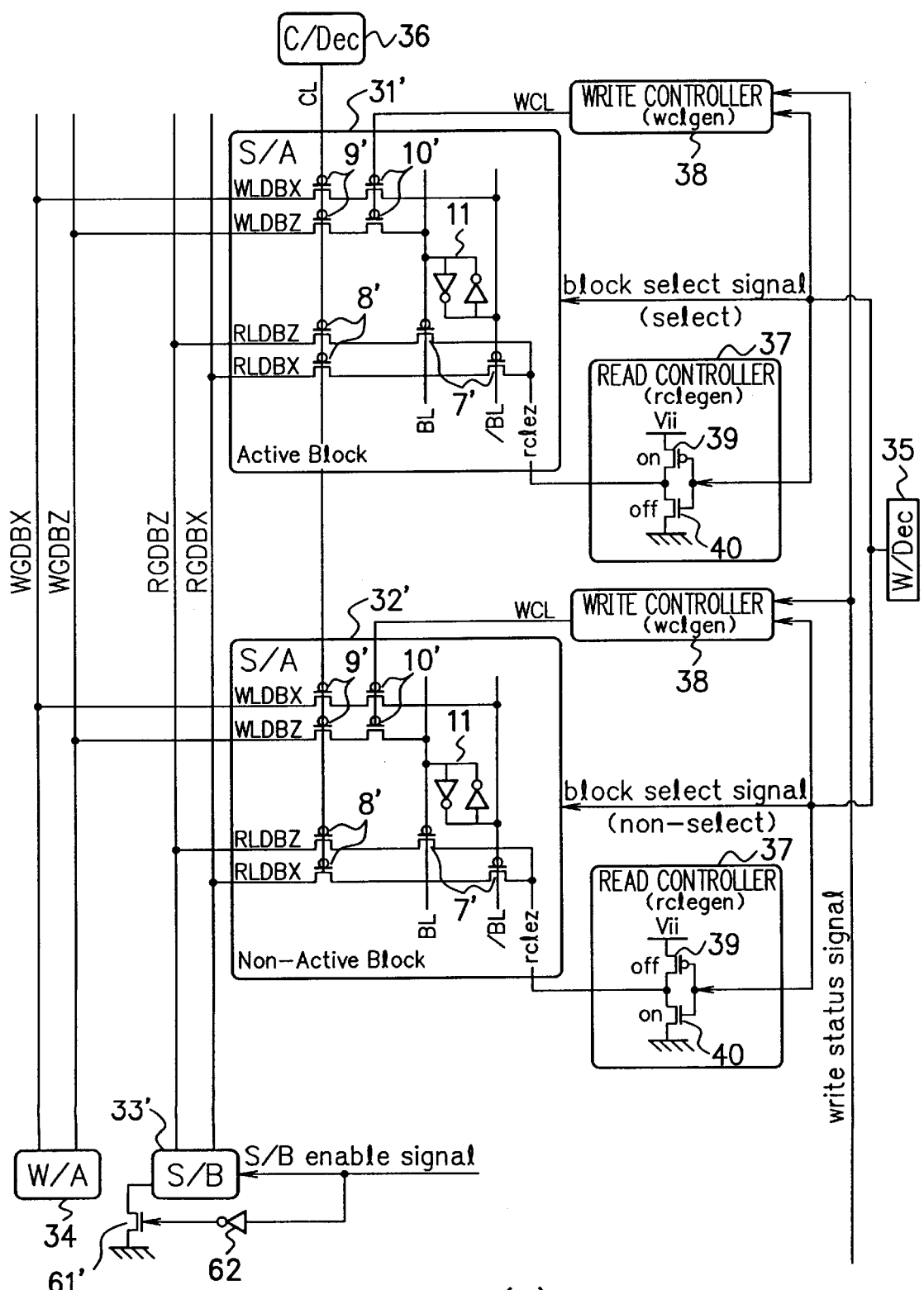
FIG. 13 is a circuit diagram showing part of the arrangement of the semiconductor memory according to the fifth embodiment of the present invention that corresponds to FIG. 9.

In FIG. 10 or 11, a NAND gate 71 replaces the NOR gate 42 used in the read controller 41 or 51 in FIG. 6 or 7. In FIG. 12 or 13, an n-channel transistor 61' (corresponding to the n-channel transistors 21' and 22' in FIG. 5) is formed between the S/B 33' and ground, instead of the p-channel transistor 61 formed between the high-potential power supply Vii and S/B 33 in FIG. 8 or 9.

For example, in the arrangement of FIG. 10, when the write status signal changes to "L" in a write, a block select signal, which has changed to "L" in order to select a block subjected to a data write, is gated through the NAND gate 71 in a read controller 41' to output an "H" logic signal from the NAND gate 71.

A p-channel transistor 39 and an n-channel transistor 40 in the read controller 41' are respectively turned off and on. The read enable signal rclez can change to the same "L" level as the ground potential of the S/B 33' to prevent any read detection current from flowing from the read controller 41' to the S/B 33'. Also in the arrangement of FIG. 11, the same operation can prevent any wasteful read detection current from flowing from a read controller 51' to the S/B 33' in a write.

In the arrangement of FIG. 12, when the write status signal changes to "L" in a write, the n-channel transistor 61' is turned off to disconnect the S/B 33' from the ground, so no read detection current flows from a read controller 37 to the S/B 33'. Also in the arrangement of FIG. 13, when the S/B activation signal changes to "H" in a write, this signal is supplied to the n-channel transistor 61' via the inverter 62 to turn the n-channel transistor 61' off. This can prevent any read detection current from flowing from the read controller 37 to the S/B 33'.

Note that the arrangement, wiring, and the like shown in each embodiment are merely an example for implementing the present invention, and do not limit the spirit and scope of the present invention. The present invention allows various modifications within its spirit and scope.

For example, each embodiment has exemplified a semiconductor memory having a current detection type read data bus amplifier for converting the voltage of data read out to bit lines into a current, and detecting and amplifying the current difference. The present invention can also apply to a semiconductor memory having a voltage detection type read data bus amplifier for detecting and amplifying a voltage difference between a pair of bit lines. Even this type of semiconductor memory for detecting a voltage difference generated between a pair of bit lines may flow a current through a read data bus in accordance with the voltage difference. The present invention is thus effective to cut off the current flow in a write.

The embodiments in FIGS. 6 and 7 use the NOR gate 42 and inverter 43 as circuit for cutting off the read detection current path in a write, but the logic circuit is not limited to this arrangement. The logic circuit can employ any arrangement as far as the output signal depends on the block select signal level for an "L" write status signal in a data read, and always changes to "L" for an "H" write status signal in a write.

The embodiments in FIGS. 10 and 11 use the NAND gate 71 and inverter 43 as circuit for cutting off the read detection current path in a write, but the logic circuit is not limited to this arrangement. The logic circuit can employ any arrangement as far as the output signal depends on the block select signal level for an "H" write status signal in a data read, and always changes to "H" for an "L" write status signal in a write.

The embodiments in FIGS. 8, 9, 12, and 13 use the p-channel transistor 61 or n-channel transistor 61' as switching circuit which is turned off in a write, but the switching circuit can employ another arrangement as far as it is turned off in a write.

What is claimed is:

1. A semiconductor memory device having a sense amplifier and a bus amplifier for amplifying data of a selected memory cell, said device comprising:
a cutoff circuit for cutting off a path for flowing a read detection current via said sense amplifier and bus amplifier selected based on an address in a data write to the selected memory cell.

2. A device according to claim 1, wherein said cutoff circuit comprises a circuit for calculating logic between a select signal generated based on the address and a write status signal, so as to change the potential at an enable signal generation circuit for operating said sense amplifier, into the same potential as that at said bus amplifier when said write status signal is activated.

3. A device according to claim 1, wherein said cutoff circuit comprises a circuit for calculating logic between a select signal generated based on the address and a write status signal, so as to open connection of an enable signal generation circuit for operating said sense amplifier when said write status signal is activated.

4. A device according to claim 1, wherein said cutoff circuit comprises a switching circuit which is turned on/off in accordance with a write status signal, and opens connection of said bus amplifier when said write status signal is activated.

5. A device according to claim 1, wherein said cutoff circuit comprises a switching circuit which is turned on/off in accordance with an inverted signal of a bus amplifier activation signal, and opens connection of said bus amplifier when said bus amplifier activation signal is activated.

6. A semiconductor memory device having a sense amplifier for converting the voltage of data read out from a selected memory cell, into a current, and a current detection type read data bus amplifier for flowing a current to amplify data, said device comprising:
a cutoff circuit for cutting off a path for flowing a read detection current in a data write to the selected memory cell.

7. A device according to claim 6, wherein said read detection current flows from a high-potential power supply of said read data bus amplifier to the ground of an enable signal generation circuit for operating said sense amplifier in accordance with a select signal based on an address.

8. A device according to claim 7, wherein said cutoff circuit cuts off said read detection current by supplying a write status signal in addition to said select signal to said enable signal generation circuit, calculating the logic between said select signal and write status signal, and changing the potential on the enable signal generation circuit side to the power supply potential when said write status signal is activated.

9. A device according to claim 7, wherein said cutoff circuit cuts off said read detection current by supplying a write status signal in addition to said select signal to said enable signal generation circuit, calculating the logic between said select signal and write status signal, and opening the ground side of said enable signal generation circuit when said write status signal is activated.

10. A device according to claim 7, wherein said cutoff circuit cuts off said read detection current by supplying a write status signal to a switching circuit arranged on the read data bus amplifier side, and opening the high-potential power supply side of said read data bus amplifier when said write status signal is activated.

11. A device according to claim 7, wherein said cutoff circuit cuts off said read detection current by supplying an inverted signal of a read data bus amplifier activation signal to a switching circuit arranged on the read data bus amplifier side, and opening the high-potential power supply side of said read data bus amplifier when said read data bus amplifier activation signal is activated.

12. A device according to claim 6, wherein said read detection current flows from a high-potential power supply of an enable signal generation circuit for operating said sense amplifier in accordance with a select signal based on an address, to the ground of said read data bus amplifier.

13. A device according to claim 12, wherein said cutoff circuit cuts off said read detection current by supplying a write status signal in addition to said select signal to said enable signal generation circuit, calculating the logic between said select signal and write status signal, and changing the potential on the enable signal generation circuit side to the ground potential when said write status signal is activated.

14. A device according to claim 12, wherein said cutoff circuit cuts off said read detection current by supplying a write status signal in addition to said select signal to said enable signal generation circuit, calculating the logic between said select signal and write status signal, and opening the high-potential power supply side of said enable signal generation circuit when said write status signal is activated.

15. A device according to claim 12, wherein said cutoff circuit cuts off said read detection current by supplying a write status signal to a switching circuit arranged on the read data bus amplifier side, and opening the ground side of said read data bus amplifier when said write status signal is activated.

16. A device according to claim 12, wherein said cutoff circuit cuts off said read detection current by supplying an inverted signal of a read data bus amplifier activation signal to a switching circuit arranged on the read data bus amplifier side, and opening the ground side of said read data bus amplifier when said read data bus amplifier activation signal is activated.

* * * * *